(12) United States Patent
Dugas et al.

(10) Patent No.: US 7,386,934 B2
(45) Date of Patent: Jun. 17, 2008

(54) DOUBLE LAYER PATTERNING AND TECHNIQUE FOR MILLING PATTERNS FOR A SERVO RECORDING HEAD

(75) Inventors: Matthew P. Dugas, St. Paul, MN (US); Joseph Tersteeg, Columbia Heights, MN (US)

(73) Assignee: Advanced Research Corporation, White Bear Lake, MN (US)

( * ) Notice: Subject to any disclaimer, the term of this patent is extended or adjusted under 35 U.S.C. 154(b) by 0 days.

(21) Appl. No.: 11/340,090

(22) Filed: Jan. 26, 2006

(65) Prior Publication Data

US 2006/0213053 A1 Sep. 28, 2006

Related U.S. Application Data

(63) Continuation of application No. 10/298,764, filed on Nov. 18, 2002, now abandoned, which is a continuation-in-part of application No. 09/922,546, filed on Aug. 3, 2001, now Pat. No. 6,678,116, which is a continuation of application No. 09/255,762, filed on Feb. 23, 1999, now Pat. No. 6,269,533.

(51) Int. Cl.
*G11B 5/127* (2006.01)
*H04R 31/00* (2006.01)

(52) U.S. Cl. .................. 29/603.16; 29/603.11; 29/603.13; 29/825; 29/851; 204/192.32; 216/29; 216/39; 216/41; 360/122; 360/317

(58) Field of Classification Search ............. 29/603.07, 29/603.11, 603.13, 603.16, 825, 603.2, 851; 360/122, 126, 127; 216/29, 39, 41; 204/192.32–19
See application file for complete search history.

(56) References Cited

U.S. PATENT DOCUMENTS

| | | | |
|---|---|---|---|
| 3,699,334 | A | 10/1972 | Cohen et al. |
| 4,088,490 | A | 5/1978 | Duke et al. |
| 4,457,803 | A | 7/1984 | Takigawa |
| 4,535,376 | A | 8/1985 | Nomura et al. |
| 4,758,304 | A | 7/1988 | McNeil et al. |

(Continued)

FOREIGN PATENT DOCUMENTS

EP  0 913 813 A2  10/1998

(Continued)

OTHER PUBLICATIONS

"A planarization technology using a bias-deposited dielectric film and an etch-back process", Fujiii, S.; Fukumoto, M.; Fuse, G; Ohzone, T.; Electron Devices, IEEE Transactions on, vol. 35, Issue 11, Nov. 1988, pp. 1829-1833.

(Continued)

*Primary Examiner*—Paul D Kim
(74) *Attorney, Agent, or Firm*—Dorsey & Whitney LLP

(57) ABSTRACT

Double photolithography is used to produce an under-layer of protective and filtering photoresist over a substrate that will have channels milled with a FIB. Secondary layers are applied with precision on top of the first layer in order to define the precise patterns to be milled and to provide targeting and alignment fiducials.

26 Claims, 14 Drawing Sheets

U.S. PATENT DOCUMENTS

| | | | |
|---|---|---|---|
| 4,906,552 A * | 3/1990 | Ngo et al. ................. | 430/312 |
| 5,016,342 A | 5/1991 | Pisharody et al. | |
| 5,035,787 A | 7/1991 | Parker et al. | |
| 5,067,230 A | 11/1991 | Meunier et al. | |
| 5,086,015 A | 2/1992 | Itoh et al. | |
| 5,093,980 A | 3/1992 | Maurice et al. | |
| 5,126,231 A | 6/1992 | Levy | |
| 5,189,580 A | 2/1993 | Pisharody et al. | |
| 5,211,734 A | 5/1993 | Yagami et al. | |
| 5,301,418 A | 4/1994 | Dirne et al. | |
| 5,402,295 A | 3/1995 | Suzuki et al. | |
| 5,405,734 A | 4/1995 | Aita | |
| 5,447,598 A | 9/1995 | Mihara et al. | |
| 5,452,166 A | 9/1995 | Aylwin et al. | |
| 5,504,339 A | 4/1996 | Masuda | |
| 5,523,185 A | 6/1996 | Goto | |
| 5,567,333 A | 10/1996 | Hira et al. | |
| 5,572,392 A | 11/1996 | Aboaf et al. | |
| 5,585,307 A * | 12/1996 | Yoo .......................... | 438/666 |
| 5,616,921 A | 4/1997 | Talbot et al. | |
| 5,639,509 A | 6/1997 | Schemmel | |
| 5,652,015 A | 7/1997 | Aboaf et al. | |
| 5,665,251 A | 9/1997 | Robertson et al. | |
| 5,675,461 A | 10/1997 | Aylwin et al. | |
| 5,677,011 A | 10/1997 | Hatakeyama et al. | |
| 5,689,384 A | 11/1997 | Albrecht et al. | |
| 5,715,597 A | 2/1998 | Aylwin et al. | |
| 5,719,730 A | 2/1998 | Chang et al. | |
| 5,723,234 A * | 3/1998 | Yokoyama et al. ........... | 430/5 |
| 5,726,841 A | 3/1998 | Tong et al. | |
| 5,737,826 A | 4/1998 | Slade et al. | |
| 5,751,526 A | 5/1998 | Schemmel | |
| 5,752,309 A | 5/1998 | Partee et al. | |
| 5,822,159 A | 10/1998 | Fukuyama et al. | |
| 5,831,792 A | 11/1998 | Ananth | |
| 5,966,632 A * | 10/1999 | Chen et al. ................. | 438/652 |
| 6,090,507 A | 7/2000 | Grenon et al. | |
| 6,156,487 A | 12/2000 | Jennison et al. | |
| 6,163,436 A | 12/2000 | Sasaki et al. | |
| 6,165,649 A | 12/2000 | Grenon et al. | |
| 6,190,836 B1 | 2/2001 | Grenon et al. | |
| 6,229,669 B1 | 5/2001 | Beck | |
| 6,269,533 B2 | 8/2001 | Dugas | |
| 6,445,550 B1 | 9/2002 | Ishi | |
| 6,635,404 B1 * | 10/2003 | Choi et al. ................. | 430/311 |
| 6,678,116 B2 | 1/2004 | Dugas | |
| 6,987,648 B2 | 1/2006 | Dugas | |
| 2001/0003862 A1 | 6/2001 | Dugas | |
| 2002/0058204 A1 | 5/2002 | Kjojasteh et al. | |
| 2002/0061465 A1 | 5/2002 | Hasegawa et al. | |
| 2002/0177066 A1 | 11/2002 | Song | |

FOREIGN PATENT DOCUMENTS

| | | |
|---|---|---|
| EP | 0913813 A | 5/1999 |
| JP | 59-008833 | 1/1984 |
| JP | 60-07847 | 4/1985 |
| JP | 61-151667 | 6/1986 |
| JP | 61174630 A | 8/1986 |
| JP | 61-291074 | 12/1986 |
| JP | 02097659 | 4/1990 |
| JP | 02288530 | 10/1990 |
| JP | 03324223 | 12/1991 |
| JP | 04091317 | 4/1992 |
| JP | 06035569 | 3/1994 |
| JP | 06242827 | 10/1994 |
| JP | 06333210 A | 12/1994 |
| JP | 07187016 | 7/1995 |
| WO | WO 9740493 | 10/1997 |

OTHER PUBLICATIONS

Yigun, Li, et al. "Magnetic Properties and Crystal Structure of FeTaAlN Soft Magnetic Materials for MIG Head", (Abstract).

Albrecht, Thomas et al., "Time-Based, Track-Following Servos for Linear tape Drives", Data Storage, Oct. 1997.

Monigle, William C. "FIBs Probe and Fix Semiconductor Problems", Test & Measurement World, May 1988.

McDermott, Michael, "Head Makers Discovery Focused Ion Beams", Data Storage, Mar. 1998.

Hisatoshi, Hata, Patent Abstracts of Japan (Publication No. 06333210), Feb. 12, 1994.

* cited by examiner

DOUBLE LAYER PATTERNING AND TECHNIQUE FOR MILLING PATTERNS FOR A SERVO RECORDING HEAD

CROSS REFERENCE TO RELATED APPLICATIONS

This Application is a continuation of U.S. Ser. No. 10/298,764, filed Nov. 18, 2002, now abandoned which is a Continuation-in-Part of U.S. Ser. No. 09/922,546, filed on Aug. 3, 2001, now issued as U.S. Pat. No. 6,678,116, which is a Continuation of U.S. Ser. No. 09/255,762, filed on Feb. 23, 1999, now issued as U.S. Pat. No. 6,269,533, the contents of which are incorporated herein by reference.

FIELD OF THE INVENTION

This invention relates generally to magnetic recording heads and to a method of making thin-film magnetic heads for imprinting time based servo patterns onto a magnetic media.

BACKGROUND OF THE INVENTION

While a variety of data storage mediums are available, magnetic tape remains a preferred forum for economically storing large amounts of data. In order to facilitate the efficient use of this media, magnetic tape will have a plurality of data tracks extending in a transducing direction of the tape. Once data is recorded onto the tape, one or more data read heads will read the data from those tracks as the tape advances, in the transducing direction, over the read head. It is generally not feasible to provide a separate read head for each data track, therefore, the read head(s) must move across the width of the tape (in a translating direction), and center themselves over individual data tracks. This translational movement must occur rapidly and accurately.

In order to facilitate the controlled movement of a read head across the width of the media, a servo control system is generally implemented. The servo control system consists of a dedicated servo track embedded in the magnetic media and a corresponding servo read head which correlates the movement of the data read heads.

The servo track contains data, which when read by the servo read head is indicative of the relative position of the servo read head with respect to the magnetic media in a translating direction. In one type of traditional arrangement, the servo track was divided in half. Data was recorded in each half track, at different frequencies. The servo read head was approximately as wide as the width of a single half track. Therefore, the servo read head could determine its relative position by moving in a translating direction across the two half tracks. The relative strength of a particular frequency of data would indicate how much of the servo read head was located within that particular half track.

While the half track servo system is operable, it is better suited to magnetic media where there is no contact between the storage medium and the read head. In the case of magnetic tape, the tape actually contacts the head as it moves in a transducing direction. Both the tape and the head will deteriorate as a result of this frictional engagement; thus producing a relatively dirty environment. As such, debris will tend to accumulate on the read head which in turn causes the head to wear even more rapidly. Both the presence of debris and the wearing of the head have a tendency to reduce the efficiency and accuracy of the half track servo system.

Recently, a new type of servo control system was created which allows for a more reliable positional determination by reducing the signal error traditionally generated by debris accumulation and head wear. U.S. Pat. No. 5,689,384, issued to Albrect et al. on Nov. 19, 1997, introduces the concept of a timing based servo pattern, and is herein incorporated by reference in its entirety.

In a timing based servo pattern, magnetic marks (transitions) are recorded in pairs within the servo track. Each mark of the pair will be angularly offset from the other. Virtually any pattern, other than parallel marks, could be used. For example, a diamond pattern has been suggested and employed with great success. The diamond will extend across the servo track in the translating direction. As the tape advances, the servo read head will detect a signal or pulse generated by the first edge of the first mark. Then, as the head passes over the second edge of the first mark, a signal of opposite polarity will be generated. Now, as the tape progresses no signal is generated until the first edge of the second mark is reached. Once again, as the head passes the second edge of the second mark, a pulse of opposite polarity will be generated. This pattern is repeated indefinitely along the length of the servo track. Therefore, after the head has passed the second edge of the second mark, it will eventually arrive at another pair of marks. At this point, the time it took to move from the first mark to the second mark is recorded. Additionally, the time it took to move from the first mark (of the first pair) to the first mark of the second pair is similarly recorded.

By comparing these two time components, a ratio is determined. This ratio will be indicative of the position of the read head within the servo track, in the translating direction. As the read head moves in the translating direction, this ratio will vary continuously because of the angular offset of the marks. It should be noted that the servo read head is relatively small compared to the width of the servo track. Ideally, the servo head will also be smaller than one half the width of a data track. Because position is determined by analyzing a ratio of two time/distance measurements, taken relatively close together, the system is able to provide accurate positional data, independent of the speed (or variance in speed) of the media.

By providing more than one pair of marks in each grouping, the system can further reduce the chance of error. As the servo read head scans the grouping, a known number of marks should be encountered. If that number is not detected, the system knows an error has occurred and various corrective measures may be employed.

Of course, once the position of the servo read head is accurately determined, the position of the various data read heads can be controlled and adjusted with a similar degree of accuracy.

When producing magnetic tape (or any other magnetic media) the servo track is generally written by the manufacturer. This results in a more consistent and continuous servo track, over time. To write the timing based servo track described above, a magnetic recording head bearing the particular angular pattern as its gap structure, must be utilized. As it is advantageous to minimize the amount of tape that is dedicated to servo tracks, to allow for increased data storage, and it is necessary to write a very accurate pattern, a very small and very precise servo recording head must be fabricated.

Historically, servo recording heads having a timing based pattern have been created utilizing known plating and photolithographic techniques. A head substrate is created to form the base of the recording head. Then, a pattern of photoresist is deposited onto that substrate. The photoresist pattern essentially forms the gap in the head. Therefore, the pattern will replicate the eventual timing based pattern. After the pattern has been applied a magnetically permeable material such as NiFe is plated around the photoresist pattern. Once so formed, the photoresist is washed away leaving a head having a thin film magnetic substrate with a predefined recording gap.

Alternatively, ion milling is used to form a first layer having a relatively large gap. A pattern of photoresist is applied in an inverse of the above described pattern. That is, photoresist is applied everywhere except where the timing based pattern (gap) is to be formed. Ion milling is used to cut the gap through the first layer. Then an additional layer of the magnetically permeable material is deposited by plating over the first layer and a narrow gap is formed into this layer by the above described photolithographic process. This approach produces a more efficient head by creating a thicker magnetic pole system.

While the above techniques are useful in producing timing based recording heads, they also limit the design characteristics of the final product. In the first method, only materials which may be plated can be utilized, such as NiFe (Permalloy). Generally, these materials do not produce heads which have a high wear tolerance. As such, these heads will tend to wear out in a relatively short time. In addition, this class of materials have a low magnetic moment density (10 kGauss for NiFe), or saturation flux density, which limits their ability to record on very high coercivity media.

The second method also relies on plating for the top magnetic layer and is therefore limited to the same class of materials. In addition, the use of ion milling makes the fabrication of such a head overly complex. The photoresist pattern can be applied relatively precisely; thereby forming a channel over the gap. However, the traditional ion milling technique is rather imprecise and as the ions pass through that channel they are continuously being deflected. Conceptually, in any recording gap, so cut, the relative aspect ratios involved prevent a precise gap from being defined. In other words, this is a shadowing effect created by the photoresist and causes the gap in the magnetically permeable material to be angled. Generally, the sidewalls of the gap will range between 45°-60° from horizontal. This introduces a variance into the magnetic flux as it exits the gap, resulting in a less precise timing based pattern being recorded onto the servo track.

SUMMARY OF THE INVENTION

The present invention includes a method for fabricating a magnetic recording head and a patterning and alignment system for defining areas to be milled during fabrication.

In one embodiment, the invention is a method that comprises providing a first layer of photoresist on a substrate and providing a second layer of photoresist on an upper surface of the first layer to define a target area with the second layer of photoresist. The target area is milled with a milling device.

In another embodiment, the substrate includes a thin film on at least a portion of an upper surface of the substrate, wherein the first layer of photoresist is provided over at least a portion of the thin film.

In another embodiment, the second layer of photoresist includes a plurality of target areas each defined by an independent portion of the second layer.

In another embodiment, the second layer of photoresist defines a writing gap for a magnetic recording head. Alternatively, the second layer of photoresist defines a timing based writing gap for a magnetic recording head.

In another embodiment the first and second layers of photoresist are positioned so that any milling of the target area will result in boundaries milled through photoresist despite beam shifting with the milling device.

In another embodiment, the second layer includes at least one fiducial mark for aligning the orientation of the milling device. The fiducial mark may also be used to set up the milling device to correct for focusing, astigmatism and magnification errors.

In one embodiment, the invention is a method that comprises depositing a first layer of photoresist over an upper surface of a substrate of a partially formed magnetic recording head having a magnetically permeable thin film defining at least a portion of the upper surface. A second layer of photoresist is deposited over a portion of the first layer of photoresist, wherein the second layer defines a gap pattern to be milled to form a timing based writing gap through the thin film. A milling device is aligned to the defined gap pattern and the gap pattern is milled.

In another embodiment, the invention is a method that comprises depositing a first layer of photoresist over an upper surface of a substrate of a partially formed multi-channel magnetic recording head having a magnetically permeable thin film defining at least a portion of the upper surface. The first layer of photoresist is formed by soft baking the first layer of photoresist. Photoresist alignment patterns are deposited on top of the first layer of photoresist and over a subgap of each channel, wherein the alignment patterns define timing based gap patterns to be milled. At least one photoresist fiducial is defined in an area between channels and a focused ion beam is adjusted based on the fiducial to orientate and adjust the focused ion beam relative to the substrate. A focused ion beam is aligned visually to one alignment pattern and the gap patterns are milled through the thin film wherein any boundary milled is milled through photoresist.

In another embodiment, the present invention is a substrate for forming a magnetic recording head comprising a first magnetically permeable member, a second magnetically permeable member, and a generally magnetically impermeable member disposed between the first and second magnetically permeable members forming a head substrate and defining a subgap area on one surface of the head substrate. A magnetically permeable thin film is disposed over at least the subgap area and a first layer of photoresist is deposited over at least a portion of the one surface and covering at least a portion of the subgap area. An alignment pattern is formed from a second layer of photoresist deposited over the first layer of photoresist, wherein the alignment pattern defines writing gaps to be milled over the subgap area and the alignment pattern is positioned so that boundaries defined during milling of the writing gaps are defined through photoresist.

DETAILED DESCRIPTION OF THE PREFERRED EMBODIMENT

Figure 1:
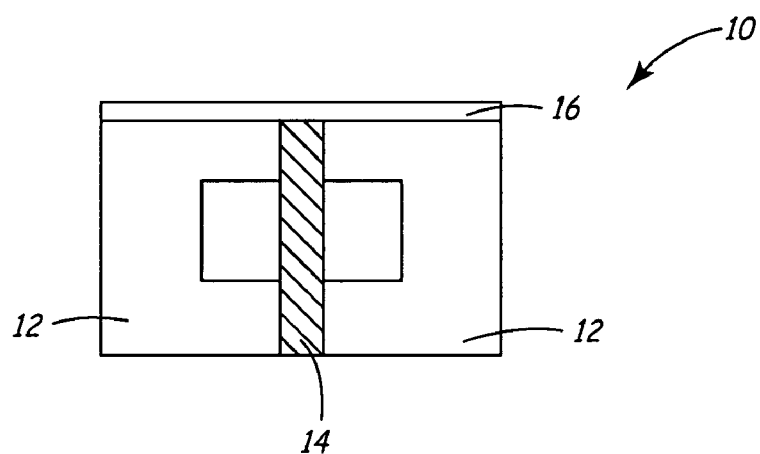
FIG. 1 is a side planar view of a substrate bearing a magnetic thin film.

The present invention is a method of making a thin film magnetic recording head using a focused ion beam (FIB) to mill out gaps in the tape bearing surface. Referring to FIG. 1, a substrate 10 is created by glass bonding two C-shaped ferrite blocks 12 to a medially disposed ceramic member 14. The sizes and relative proportions of the ferrite blocks 12 and ceramic member 14 may vary as dictated by the desired parameters of the completed recording head. Furthermore, the choice of materials may also vary so long as blocks 12 remain magnetic while member 14 remains generally magnetically impermeable.

A layer of magnetically permeable material is deposited as a thin film 16 across an upper surface of each of the ferrite blocks 12, as well as the upper surface of the ceramic member 14. The magnetically permeable thin film 16 will become the tape bearing and data writing surface for the magnetic head 5 (see FIGS. 12 & 13). As such, it is desirable to form the layer of thin film 16 from a material which has a relatively high magnetic moment density (greater or equal to about 15 kGauss) and is also wear resistant. An exemplary material for this purpose is FeN or alternatively Sendust™. For example, FeN has a magnetic moment density on the order of 19 to 20 kGauss and is resistant to the frictional deterioration caused by continuous tape engagement. Any of the alloys in the iron nitride family, such as iron aluminum nitride, iron tantalum nitride, etc., and including any number of elements, are also ideally suited. FeXN denotes the members of this family, wherein X is a single element or a combination of elements, as is known in the art.

FeXN is created by sputtering a FeX alloy (or simply Fe) in a nitrogen rich environment. It is not available in quantities sufficient for plating. Furthermore, even if so available, the FeXN would decompose during the electrolytic plating process. This is in stark contrast to the simple alloys which may be readily utilized in electrolytic plating techniques. Therefore, while it is advantageous to use alloys, such as FeXN, magnetic recording heads cannot be formed with them, in any previously known plating process. In addition, the most desirable alloys to use are often composed of three of more elements. Plating is generally limited to the so called binary alloys, and as explained above is not conducive to binary gaseous alloys, such as FeN. The use of sputtering in combination with the use of a FIB, not only allows any of these materials to be used but also produces a better wearing magnetic thin film with a higher saturation flux density and of sufficient permeability for use as a servo write head.

Referring again to FIG. 1, the thin film 16 is sputtered onto the surface of the ferrite blocks 12 and the ceramic member 14. Prior to the sputtering process, the surface is polished and prepared in a manner known to those skilled in the art. If desired, the surface may be ground to produce a slight curvature. This curvature will facilitate smooth contact between the tape and the completed head 5 as the tape moves across the tape bearing surface.

The thickness of the deposited thin film 16 determines the efficiency of the magnetic head and also its predicted wear life. The thicker the tape bearing surface (thin film 16) is, the longer the head will last. Conversely, the thicker the magnetic film, the longer it will take to process or etch with a FIB and it will also process less precisely. Therefore, the thin film should be deposited in a thickness of about 1 to 5 µm. Ideally, the thickness will be about 2 to 3 µm.

Figure 2:
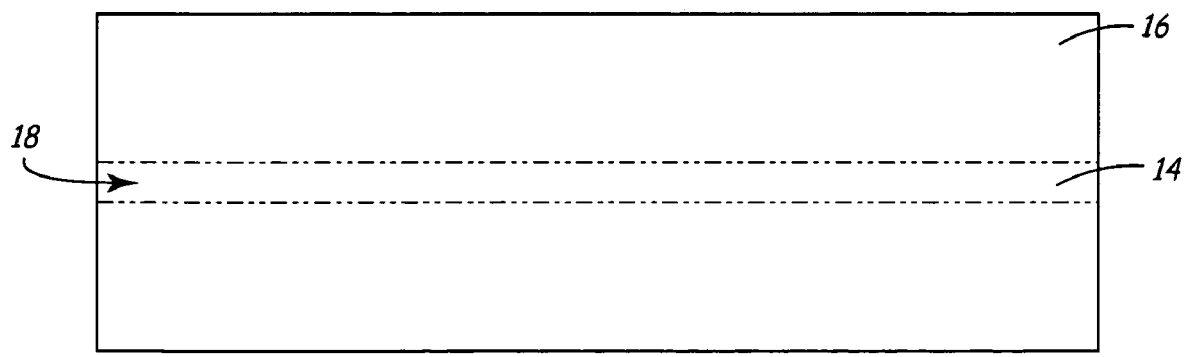
FIG. 2 is a top planar view of the substrate shown in FIG. 1.

FIG. 2 is a top view of the substrate 10 and in particular the major surface of magnetic thin film 16 with the underlying ceramic member 14 shown in dashed lines. The area 18 is generally referred to as a subgap and is defined by the upper surface of the ceramic member 14 and is where the appropriate gaps will eventually be located. The thin film covers the subgap. The subgap is the area defined by the magnetically impermeable member underneath the portion of the thin film bearing the writing gaps. Here a multichannel head will have a single, elongated and common subgap. As explained below, another configuration provides for a single, independent subgap for each channel of a recording head.

Figure 3:
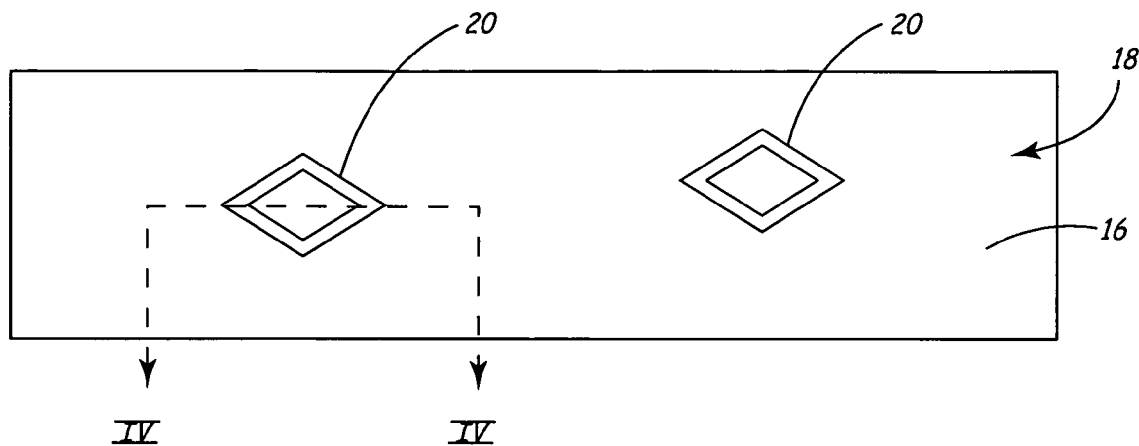
FIG. 3 is top planar view of a portion of thin film, bearing indicia of a gap to be milled.

Referring to FIG. 3, only a portion of area 18 is shown. Within area 18, some indicia 20 of the eventual gap positions are laid down as the thin film. It should be noted that two diamond shaped gaps are to be milled as shown in FIG. 3; however any shape and any number of gaps could be created. Indicia 20 is simply an indication of where the FIB is to mill. One way of accomplishing this is to place a layer of photoresist 22 down and define the indicia 20 with a mask. Using the known techniques of photolithography, a layer of photoresist 22 will remain in all of area 18 except in the thin diamond defined by indicia 20. Alternatively, the photoresist area could be substantially smaller than area 18, so long as it is sufficient to define indicia 20. The photoresist differs in color and height from the thin film 16 and therefore produces the visually discernible pattern. This pattern is then registered with the FIB control system through a graphical interface; thus delineating where the FIB is to mill. The photoresist is used to visually identify a pattern. As such, many alternatives are available. Any high resolution printing technique capable of marking (without abrading) the surface of the thin film 16 could be used. Alternatively, the pattern could be created completely within the FIB control system. That is, numerical coordinates controlling the path of the FIB and representing the pattern could be entered; thus, obviating the need for any visual indicia to be placed onto the magnetic thin film 16. Finally, a visual pattern could be superimposed optically onto the FIB graphical image of the substrate 10, thereby producing a visually definable region to mill without actually imprinting any indicia onto the substrate 10.

In any of the above described ways, the FIB 24 is programmed to trace a predefined pattern, such as the diamond indicia 20 shown in FIG. 3. The FIB will be orientated in a plane orthogonal to the major surface of the thin film 16.

Figure 4:
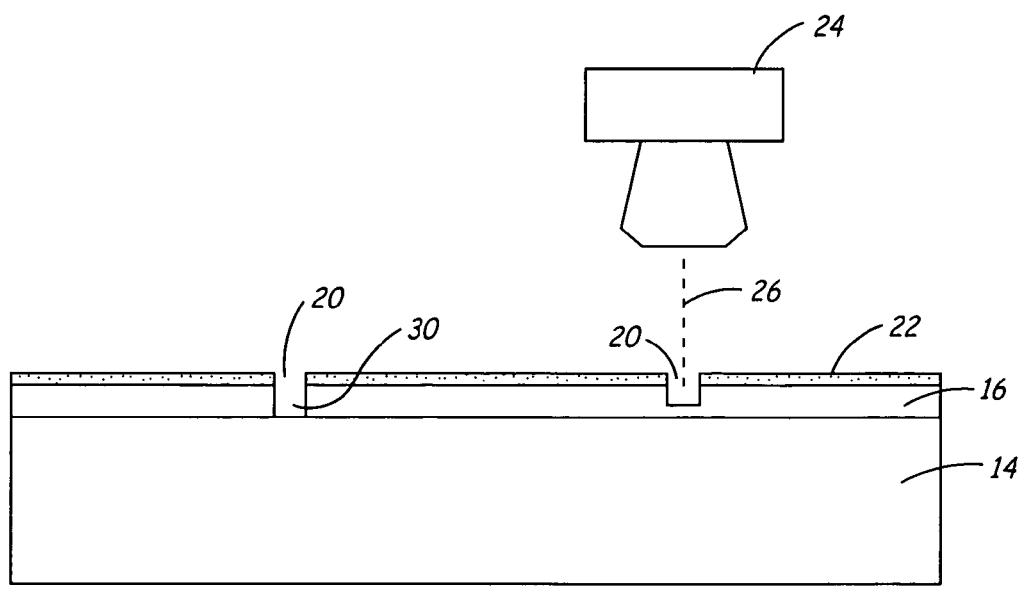
FIG. 4 is a schematic diagram of a FIB milling a gap into a thin film.

FIG. 4 is a sectional view of FIG. 3, taken about line IV-IV and illustrates the milling process utilizing FIB 24. The upper surface of the thin film 16 has been coated with a thin layer of photoresist 22. The visual indicia 20 of the diamond pattern is present, due to the area of that indicia 20 being void of photoresist. The FIB 24 has already milled a portion of the pattern forming gap 30. The FIB as shown has just begun to mill the right half of the pattern. The beam of ions 26 is precisely controlled by the predefined pattern which has been entered into the FIB's control system. As such, the beam 26 will raster back and forth within the area indicated by indicia 20. The beam 26 will create a gap 30 having vertical or nearly vertical side walls. The width of the focused ion beam is controllable and could be set to leave a predefined amount of space between the edge of the side wall and the edge of the indicia 20. The FIB 24 will raster back and forth until all of the indicia 20 have been milled for that particular head.

Figure 5:
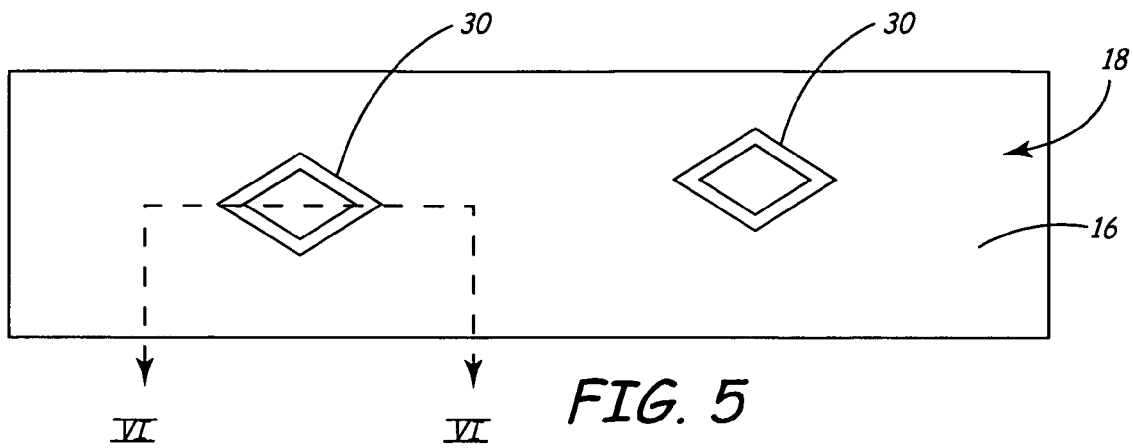
FIG. 5 is a top planar view of a thin film having gaps milled by a FIB.
Figure 6:
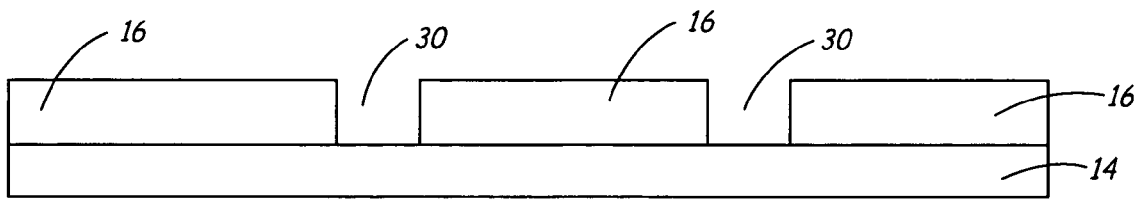
FIG. 6 is a side sectional view taken about line VI-VI.

After the FIB 24 has milled all of the gap(s) 30, the photoresist 22 is washed away. Alternatively, any other indicia used would likewise be removed. FIG. 5 illustrates area 18 of substrate 10 after the photo resist 22 has been removed. Thin film 16 is exposed and has precisely defined gaps 30 milled through its entire depth, down to the ceramic member 14. FIG. 6 is a sectional view of FIG. 5 taken about line VI-VI of FIG. 5 and illustrates the milled surface of gap 30. The gap 30 is precisely defined, having vertical or nearly vertical walls.

Figure 14:
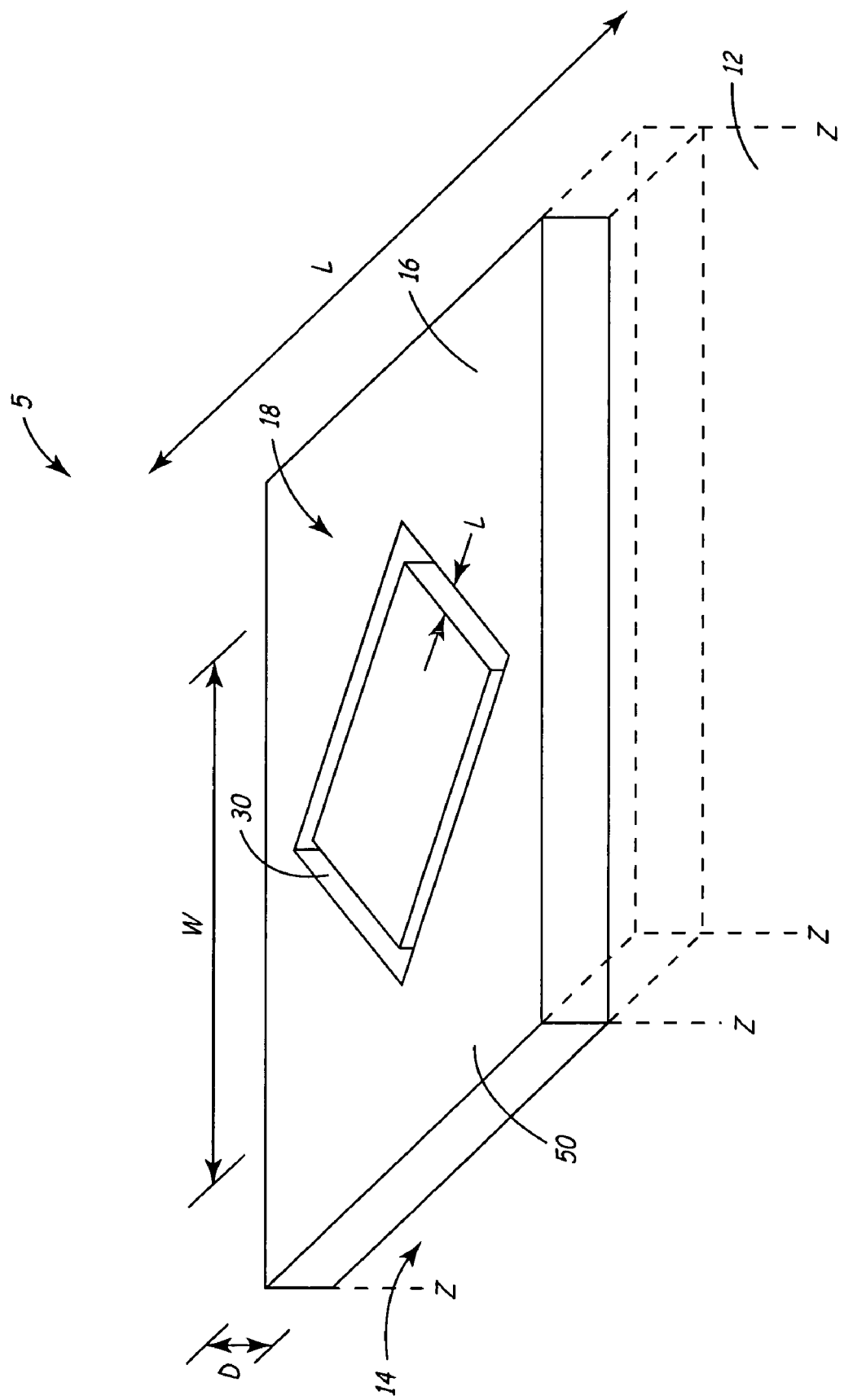
FIG. 14 is a partial perspective view of thin film layer bearing a set of time based or angled recording gap pairs.

Referring to FIG. 14, a partial perspective view of a time based recording head 5 is shown. The major surface 50 of thin film 16 lies in a plane defined by width W, length L, and depth D. D is the deposited thickness of the magnetic film 16. The FIB will always mill through thin film 16 through a plane perpendicular to the major surface 50 which would also be parallel to depth D. By conventional standards, the gap 30 will have a magnetic gap depth equal to depth D and a gap width equal to width W and a gap length (L')equal to the span of gap 30.

Figure 7:
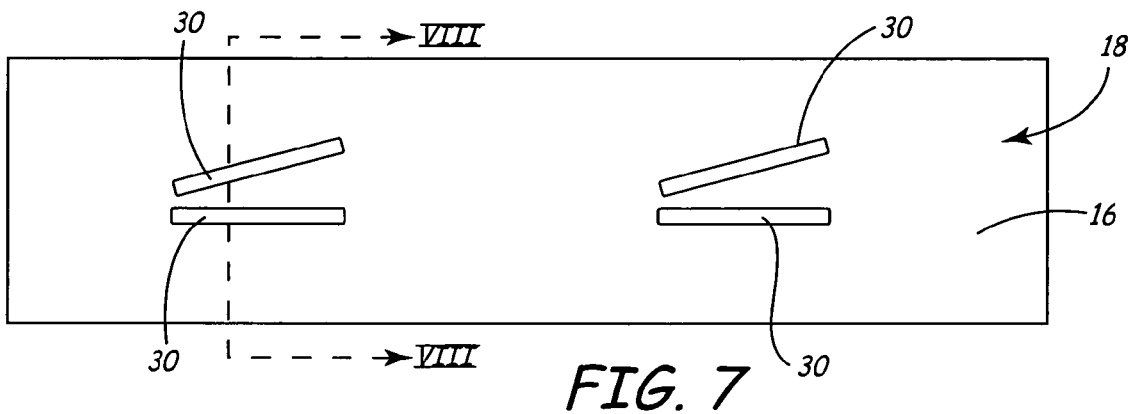
FIG. 7 is a top planar view of a thin film having gaps milled by a FIB.
Figure 8:
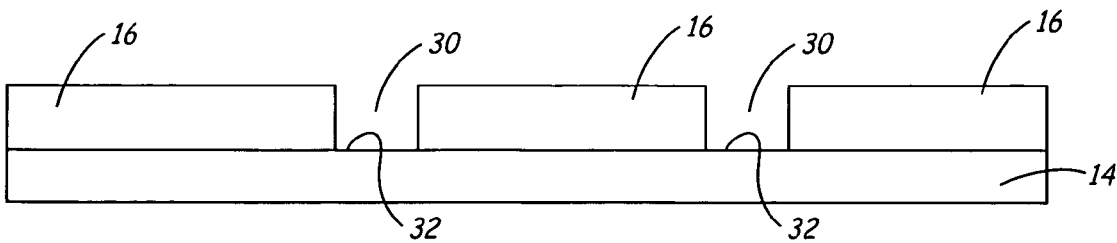
FIG. 8 is side sectional view taken about line VII-VII.

The upper surface of thin film 16, shown in FIG. 7, represents one of many alternative time based patterns which may be created using a FIB 24. Here, gaps 30 will be milled in exactly the same fashion as described above, except that indicia 20, when utilized, would have formed the pattern shown in FIG. 7. FIG. 8 is a sectional view taken about line VII-VII of FIG. 7 and shows how gap 30 continues to have precisely defined vertical sidewalk. Furthermore, the upper horizontal surface 32 of ceramic member 14 is also precisely defined.

Figure 9:
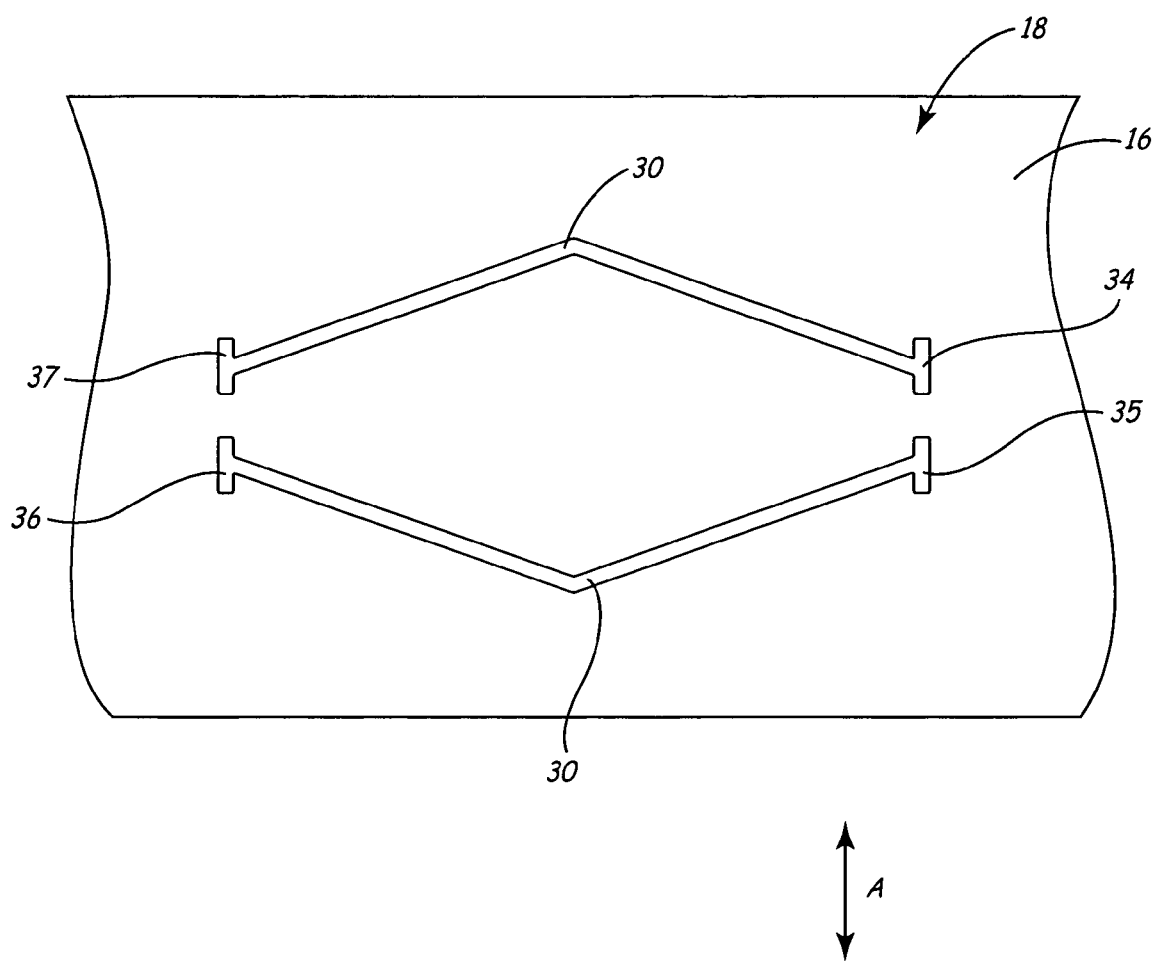
FIG. 9 is a top planar view of a portion of thin film having a gap and endpoints milled by a FIB.

FIG. 9 illustrates yet another pattern which may be defined using FIB 24. Here, gap 30 is in the shape of an augmented diamond. Rather than defining a diamond having connected corners, gap 30 is milled to have termination cells or endpoints 34, 35, 36 and 37. Creating endpoints 34, 35, 36 and 37 increases the definition of the finished recorded pattern near the ends of the track.

Figure 10:
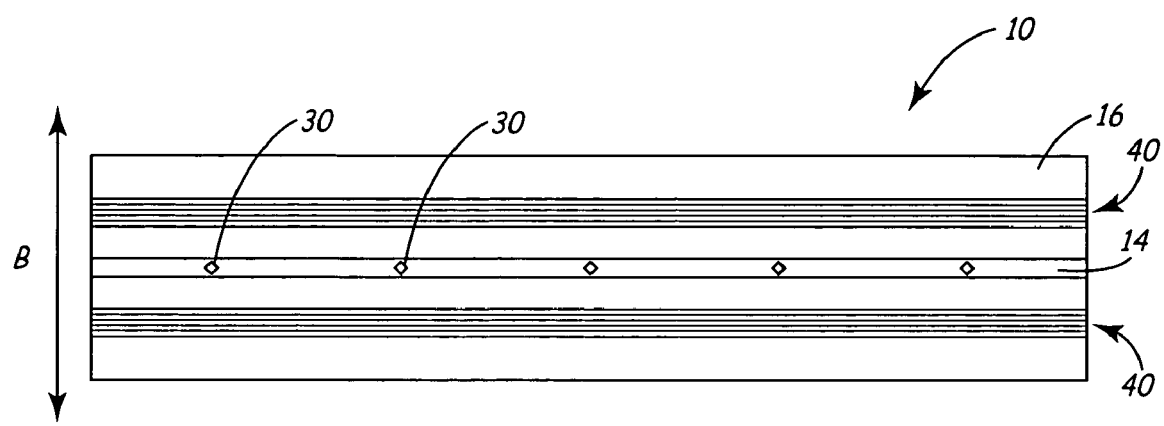
FIG. 10 is a top planar view of a substrate bearing gaps and air bleed slots.

Air bleed slots 40 are created in the tape bearing surface of the substrate 10, as shown in FIG. 10. Once substrate 10 has been fabricated into a recording head, magnetic tape will move across its upper surface in a transducing direction, as shown by Arrow B. Therefore, air bleed slots 40 are cut perpendicular to the transducing direction. As the tape moves over the recording head at relatively high speed, air entrainment occurs. That is, air is trapped between the lower surface of the tape and the upper surface of the recording head. This results from the magnetic tape, comprised of magnetic particles affixed to a substrate, being substantially non-planar on a microscopic level. As the tape moves over the recording head, the first air bleed slot encountered serves to skive off the trapped air. The second and subsequent slots continue this effect, thus serving to allow the tape to closely contact the recording head. As the tape passes over recording gap(s) 30, it is also held in place by the other negative pressure slot 42,43 encountered on the opposite side of the gap(s) 30. Therefore, there is a negative pressure slot 42,43 located on each side of the recording gap(s) 30.

Figure 11:
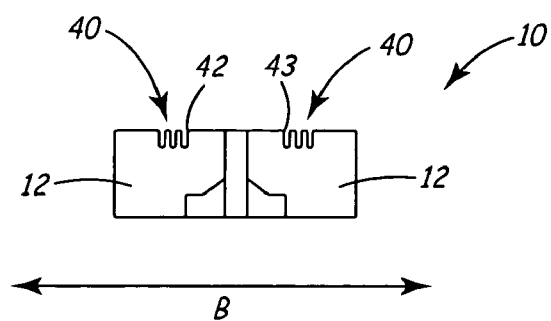
FIG. 11 is an end planar view of a substrate bearing air bleed slots.

FIG. 11 is a side view of substrate 10, as shown in FIG. 10. The upper surface of the substrate 10 has a slight curvature or contour. This acts in concert with the air bleed slots to help maintain contact with the magnetic tape. The air bleed slots 40 are cut into the substrate 10 with a precise circular saw, as is known by those skilled in the art. The air bleed slots 40 are cut through thin film 16, which is present but not visible in FIG. 11. Alternatively, the air bleed slots 40 could be cut prior to the thin film 16 having been deposited.

Figure 13:
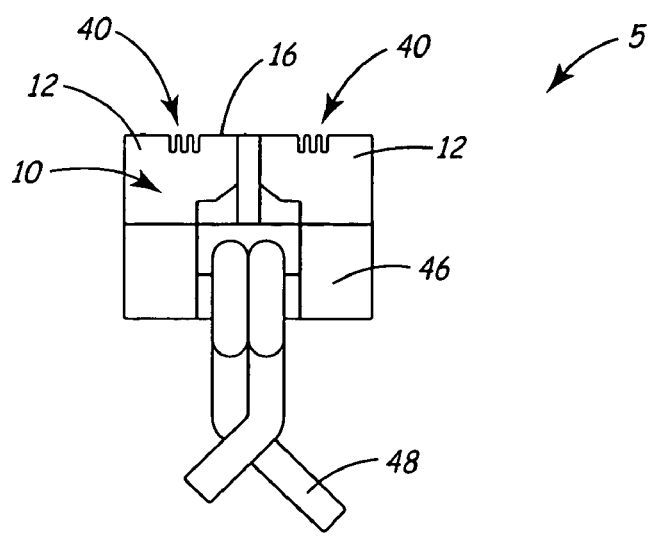
FIG. 13 is an end planar view of a magnetic recording head.

Substrate 10 has been longitudinally cut, thus removing a substantial portion of the coupled C-shaped ferrite blocks 12 and ceramic member 14. This is an optional step which results in an easier integration of the coils and ferrite blocks. FIG. 13 illustrate how a backing block 46 is bonded to substrate 10. The backing block 46 is composed of ferrite or another suitable magnetic material. Wiring is wrapped about the backing block 46 thus forming an electrical coil 48. With this step, the fabrication process has been completed and a magnetic recording head 5 has been produced.

In operation, magnetic recording head 5 is secured to an appropriate head mount. Magnetic tape is caused to move over and in contact with the tape bearing surface of the head 5, which happens to be the thin film layer 16. At the appropriate periodic interval, electrical current is caused to flow through the coil 48. As a result, magnetic flux is caused to flow (clockwise or counterclockwise in FIG. 13) through the back block 46, through the ferrite blocks 12, and through the magnetic thin film 16 (as the ceramic member 14 minimizes a direct flow from one ferrite block 12 to the other causing the magnetic flux to shunt through the permeable magnetic film). As the magnetic flux travels through the magnetic thin film 16, it leaks out through the patterned gaps 30, thus causing magnetic transitions to occur on the surface of the magnetic tape, in the same pattern and configuration as the gap 30 itself.

Figure 12:
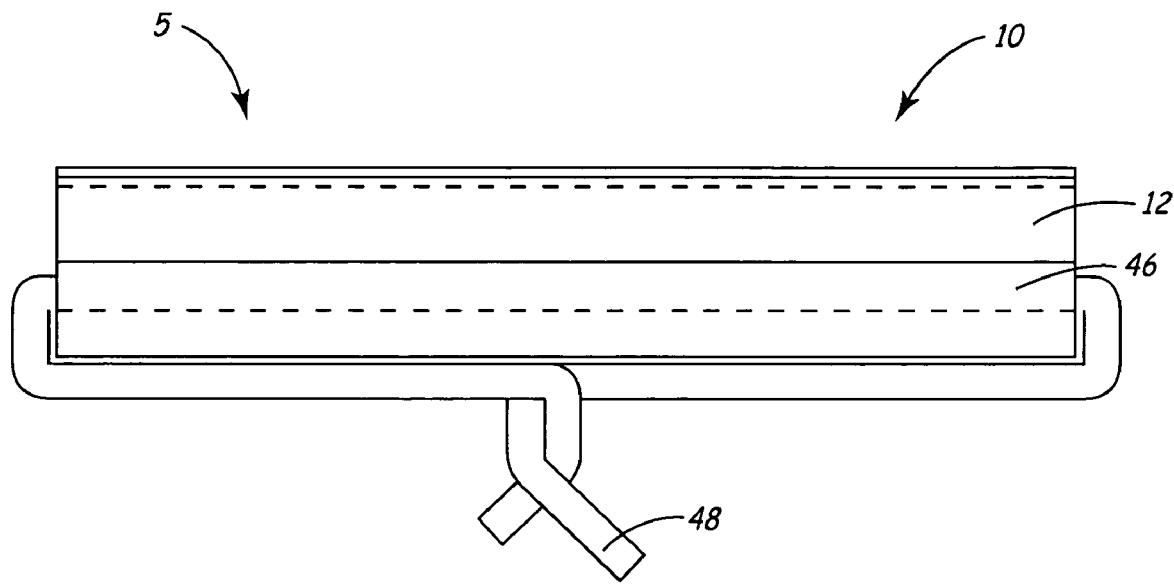
FIG. 12 is a side planar view of a magnetic recording head.

Referring to FIGS. 10 and 12, it can be seen that the width of the head 5 (or substrate 10) is substantially larger than a single patterned gap 30. This allows the recording head to bear a plurality of patterned gaps 30. For example, FIG. 10 illustrates a substrate 10 having five recording gaps 30 which could then write five servo tracks simultaneously. More or less can be utilized as desired and the final size of the head 5 can be adjusted to whatever parameters are required. Also, each patterned gap represents a channel, and as explained below, each channel could be made independent through magnetic isolation.

Rather than cutting the substrate 10 as shown in FIG. 11 and applying a coil as shown in FIG. 13, the substrate 10 could remain whole and the coils could be added to the C-shaped ferrite blocks 12, as they are shown in FIG. 1.

Figure 15:
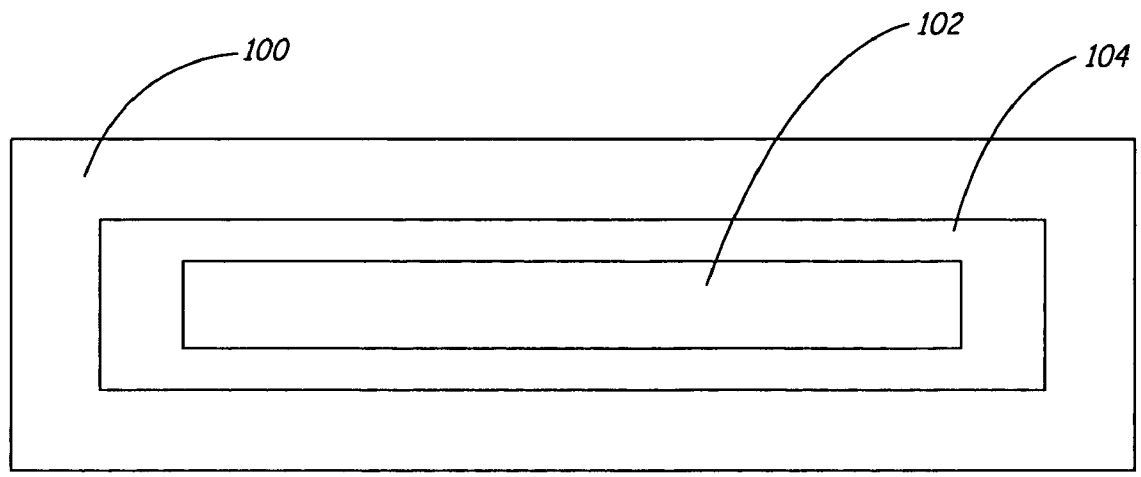
FIG. 15 is a top planar view of a portion of a substrate with a single layer photoresist pattern.

As described above, one way to align the FIB with the head member is to pattern photoresist onto the head member and then optically or visually align the FIB. FIG. 15 illustrates a generic substrate 100 (more particularly, some portion of a substrate) having a photoresist pattern 104 applied. The intent would be to mill out the rectangular area 102 with the FIB. For illustrative purposes, substrate 100 is shown generically however in practice the portion of substrate 100 actually patterned would be carefully chosen so that the photoresist pattern 104 appropriately and accurately defines an intended writing gap in the proper position and orientation.

Figure 16:
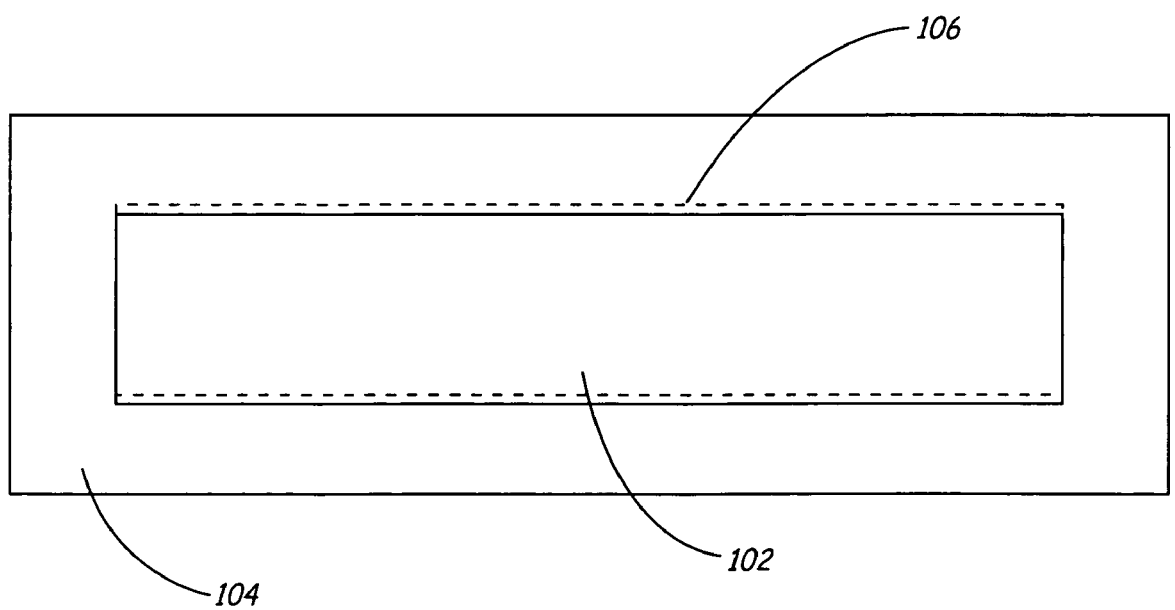
FIG. 16 is a top planar view of a single layer photoresist and a superimposed FIB milling pattern.

Thus, FIG. 16 illustrates some of the physical components, including the patterning that would be subject to alignment with a FIB. That is, the operator of the FIB would use photoresist pattern 104 as a target to properly align the cutting tool. When positioned within the proper milling area, the FIB milling area 106 actually generated (milled) by the FIB control device is illustrated over photoresist pattern 104. That is, despite the operator's best efforts to align the FIB to photoresist pattern 104, some beam shifting or misalignment is likely to occur. This results from the scale and nature of the alignment and precision that is sought through visual or numerical (coordinates) alignment. Moreover, the FIB control system often uses pattern recognition software that digitizes images and coordinates. Thus, even with ideal alignment, the software itself can generate errors of a few pixels that result in beam shift. Similarly, the machine vision that is often used by a FIB can lend to some degree of shifting when translating a visual pattern into an electronic representation. Added to all of this, the physical misalignments caused by possible problems such as stage drift (the tray holding the component to be milled moves), stray fields, and a positional error of the beam itself can further complicate the problem.

The error generated, whether due to the machine itself, the nature of the beam, or operator error will be generally referred to interchangeably as beam shift or misalignment. Beam shift is actually very small dimensionally, but considering the scale of the components themselves and the milling process in question, beam shift can be quite significant and problematic. Thus, FIB milled area 106 will often be offset somewhat from the intended or targeted milling area 102.

Figure 17:
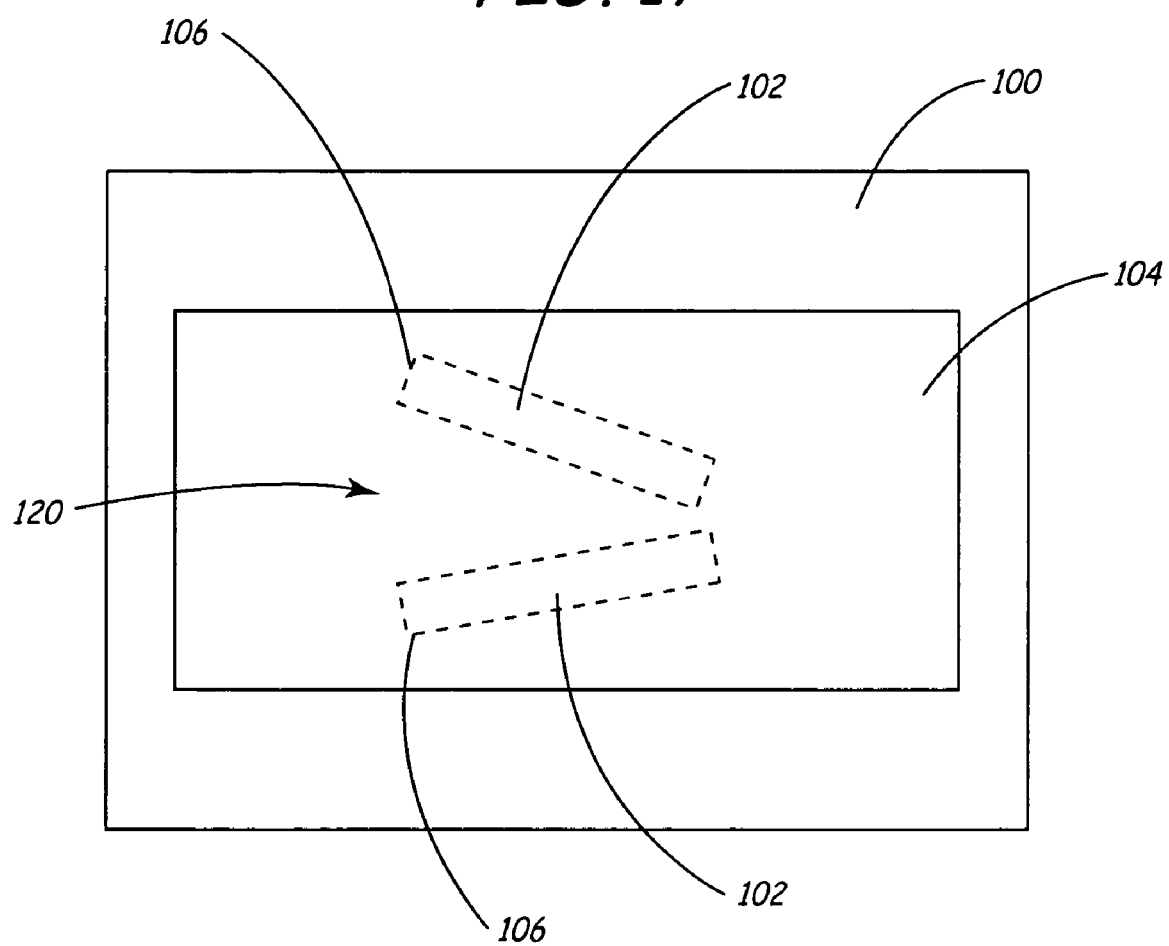
FIG. 17 is a top planar view of a portion of a substrate with a single layer photoresist and a FIB milling pattern defining a timing based servo pattern, though the illustrated gap patterns are not shown to scale.

FIG. 17 further illustrates the beam shifting that can occur when defining a dual gap timing based pattern 120. (The patterns shown are for illustrative purposes only in that they are not accurately shown to scale.) For each gap, the actual FIB milled area 106 is shifted, e.g. downward (as illustrated), somewhat from the predefined areas to be milled 104. While the actual milled areas 106 differ from predefined areas 102, the two gaps are precisely positioned with respect to one another, since the patterns are linked within the FIB control system. In other words, the FIB milled areas 106 are consistent with one another to a high degree of accuracy and any beam shifting that occurs from misalignment will affect both areas to approximately the same degree. The FIB does not actually follow or trace the visual pattern. Rather, the visual pattern is used to position and orientate the FIB and define a starting point. By "knowing" its location and orientation relative to the surface, the FIB can then move along a predetermined pathway. Thus, the dual gap pattern is precisely defined, though as a whole it can be shifted from its intended location by a small amount.

Figure 18:
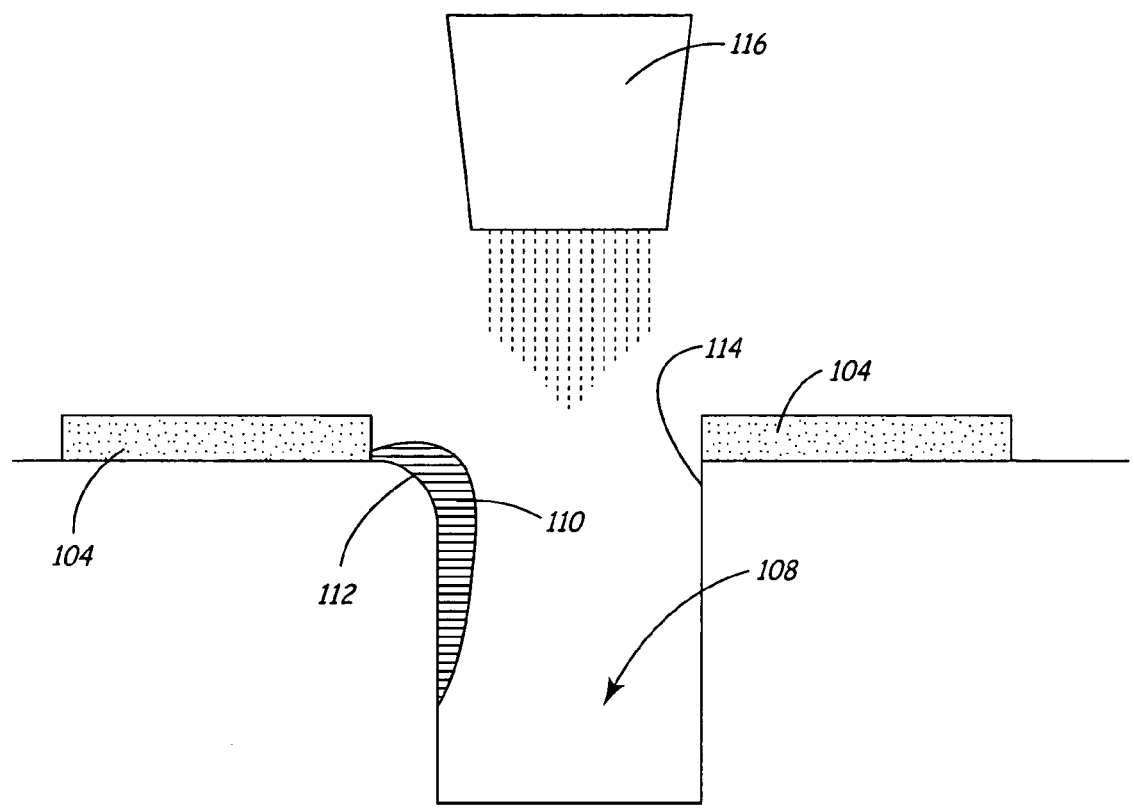
FIG. 18 is a schematic side elevation view of a FIB milling a channel through a thin film using a single layer photoresist pattern.

As illustrated in both FIGS. 16 and 17, this misalignment causes one edge of milled area 106 to be milled through a portion of photoresist pattern 104 (upper edge in FIG. 16) while the opposite edge (the lower edge in FIG. 16) is milled through substrate 100 only, and does not cut through any photoresist. In other words, the milling boundary either passes through photoresist or it does not. Of course, the side edges could also have been misaligned, though not illustrated as such. This scenario is further illustrated in FIGS. 18 and 19. Here, a FIB 116 is illustrated milling a gap 108 through substrate 100 (which might be a thin film layer). The intent, as explained above is to cut gap 108 to have vertical sidewalls (or as vertical as possible) without having redeposition occur on the upper surface. In this example, the misalignment or beam shift has caused FIB 116 to mill further to the right (as illustrated) of the pattern defined by photoresist 104. As such, FIB 116 mills through photoresist 104 to define covered edge 114 (i.e., the right most milling boundary passes through photoresist). Conversely, FIB 116 only mills through substrate 100 to define exposed gap edge 112 (i.e., the left most milling boundary does not pass through photoresist). In other words, there is a gap between the edge of photoresist 104 and the exposed gap edge 112.

Figure 19:
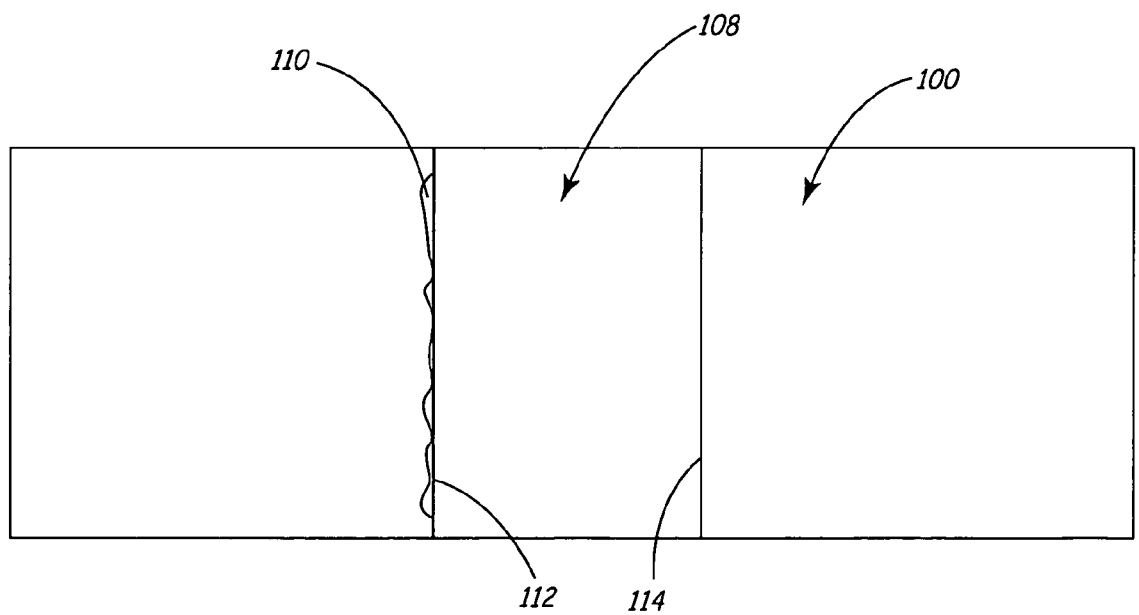
FIG. 19 if a top planar view of the thin film of FIG. 18 after milling.

FIB 116 projects a beam of Gallium atoms towards substrate 100 in a generally Gaussian distribution. When the beam strikes substrate 100, the material dislodged and the reflected Gallium atoms must go somewhere. For the most part, the material is reflected normal to the surface and is harmlessly redistributed, though Gallium exposure can lead to corrosion on other portions of the thin film. However, some of the material is redeposited along the exposed gap edge 112 and along the resulting vertical sidewall of gap 108. Of course, some of the material could be redeposited on top of photoresist 104; however, since photoresist 104 is eventually washed away the deposited material is taken with and thus will not be discussed further. Redeposited material 110 is problematic because it becomes part of substrate 100 after the milling process. (Additional, and usually non-problematic, redeposition could occur in other portions of gap 108, though not illustrated.) Not only does this affect the vertical sidewall of gap 108, it affects the upper surface of substrate 100 as illustrated in FIG. 19. While there is no effective way to subsequently remove redeposited material 110 from gap 108, the upper surface of substrate 100 can be lapped to remove that portion of redeposited material 110 existing on the upper surface. Unfortunately, such lapping is destructive to substrate 100 and greatly reduces its effective or useful lifetime. The lapping serves to fill gap 108 with debris that cannot effectively be removed and prevents debris generated from contact with the media from accumulating in the gap, increasing the frequency of required cleanings while also reducing the performance of the head. Lapping also scratches the surface of the thin film, which may lead to corrosion. As substrate 100 is the tape bearing surface in a completed recording head, leaving such redeposited material is undesirable as doing so will abrade the magnetic media, increase the debris generated from contact, and reduce the quality of the written data. In particular, redeposition 110 can lift the tape away from the recording head precisely at a time it should be close so that that the writing gaps can write the appropriate transitions.

Another effect of the Gaussian beam distribution is the rounding of exposed gap edge 112 by the "tail" of the beam as it approaches and cuts exposed gap edge 112. That is, the rounded portion of gap edge 112 is bombarded by fewer Gallium atoms than it would be if targeted by the mean distribution of the beam, since the beam is actually only directed up to exposed gap edge 112. Thus, material is removed but to a lesser degree resulting in a rounding rather than a cutting. Of course, this produces a less desirable writing gap. That is, a sharper gap edge or transition is preferred such as edge 114 in FIG. 18.

Figure 27:
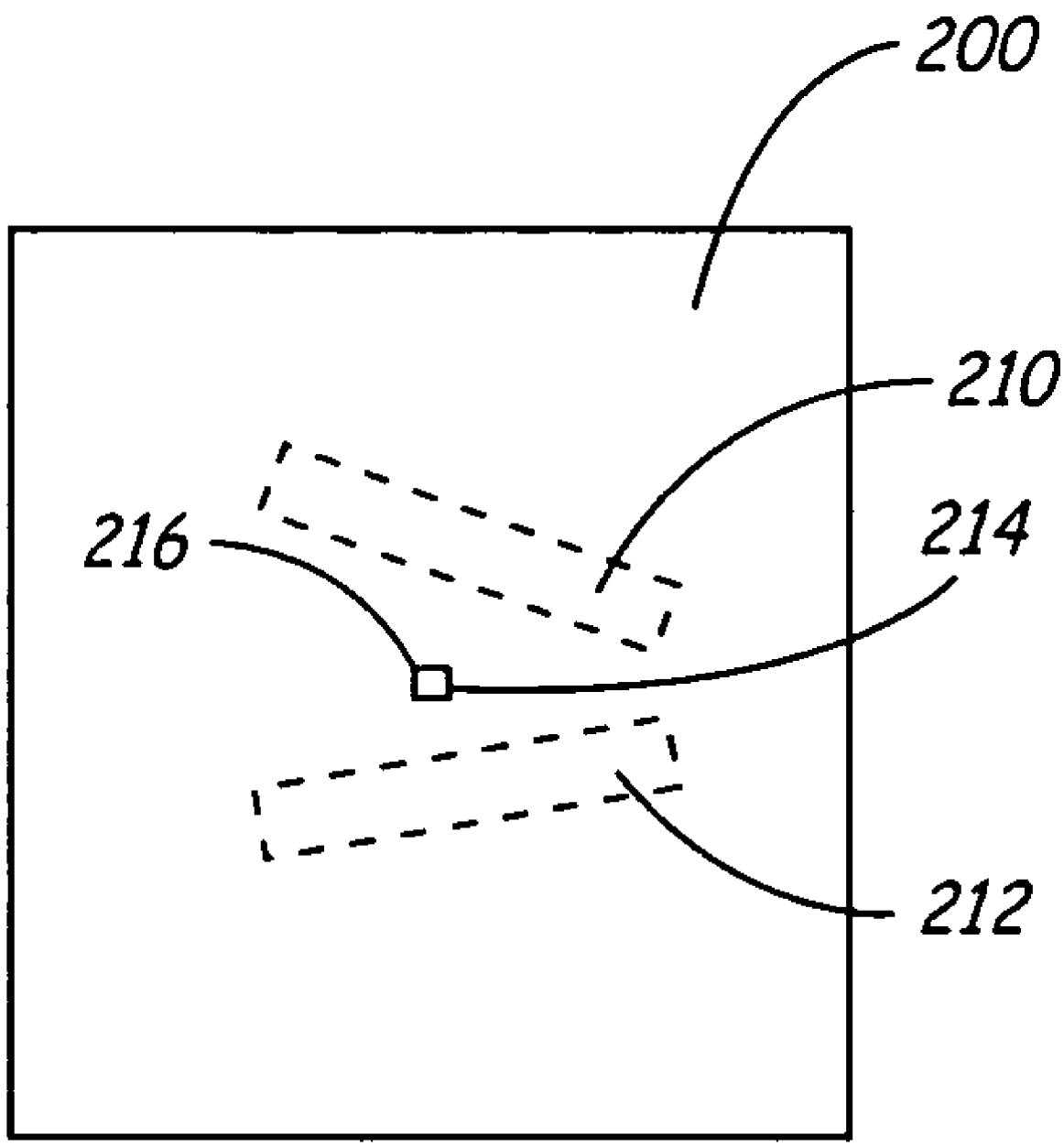
FIG. 27 is a top planar view of a substrate with a subgap having a mark indicating an origin for a coordinate system.

Thus, essentially inevitable beam shifting causes FIB 116 to mill an exposed gap edge 112 that is not protected by photoresist 104 and this leads to undesirable consequences. One possible solution to this problem would be to reduce the size of the predefined areas to be milled 102 (FIGS. 15-17). This however is also undesirable in that it greatly reduces the achievable precision of beam alignment, which is made even more important when milling timing based servo patterns. Essentially, the FIB operator would be trying to approximate an alignment and this could result in some degree of guessing. By having photoresist 104 define the actual area to be milled, the FIB operator has a true location to visually align to, despite the beam shifting that is still likely. In other words, the photoresist pattern needs to define the actual edge that should be aligned to, in order to avoid guesswork. Alternatively, the photoresist pattern can be used to define a precise starting point, and the FIB can procede to mill a predetermined pattern using a coordinate system. Pattern recognition software can be used to precisely identify the starting point as the origin of the coordinate system. Once a particular pattern is identified, a particular geometric feature can be used as the origin. For example, if the chosen pattern is a square, a particular corner or the center can be isolated and determined. Thus, a system can be used based entirely on coordinate mapping, graphical alignment or a combination of the two. For the reasons discussed, this pattern would also occur as the second layer. Referring to FIG. 27, a subgap area 200 is illustrated. Gap patterns 210 and 212 illustrate where the writing gaps are to be milled. A patterned shape 214 is provided in a precise location. The FIB imagining software identifies the square shape 214 and then determines, for example, an upper left corner 216 (as illustrated). Alternatively, two (or more) edges are identified and the geometric center of the square is then determined. Once this point is identified, it is simply a matter of moving in a stepwise fashion in an X, Y plane to mill the predetermined pattern.

Another problem with using a FIB is the alignment procedure itself. Prior to milling the actual gap, the surface of substrate 100 must be imaged (bombarded with Gallium atoms) in order to properly focus FIB 116 and correct for any astigmatism or magnification errors and to set the eucentric height in order to attempt to achieve perfect patterning of the beam with respect to the milled surface. This is generally done in an area of substrate 100 other than the eventual gap, but close to it so that the surface topology is consistent. That is, the FIB set up and alignment is performed on an area relatively close to the eventually written gaps. This still leads to a number of problems. First, even though the area is spaced from the eventual gaps and thus essentially an inactive area with respect to writing media, the imaged area is still a part of the tape bearing surface. Thus, the uniformity and evenness of the tape bearing surface is adversely affected. Second, the Gallium atoms can be corrosive to the thin film, especially NiFe and other Fe based thin films. This is problematic both where the FIB is initially imaged and wherever redeposition of scattered Gallium atoms might occur during the milling process. One solution for this would be to expand the photoresist mask to cover the entire surface. This is not acceptable however, since the surface becomes somewhat featureless with edge to edge masking making it harder to locate the gap patterns for milling. In addition, it is difficult to precisely position the gap pattern in the mask when using edge to edge masking techniques. Conceptually, it should be understood that it is difficult to have a large, dark mask cover a large object while having relatively small, clear patterns within the mask properly align to specific positions on the object.

In addition to preventing redepositon over at least an upper surface, the double layer technique presented herein allows the second layer to be applied with a "clear field mask," which in turn allows for easier and more precise alignment of the pattern to the visible features of the substrate.

Figure 20:
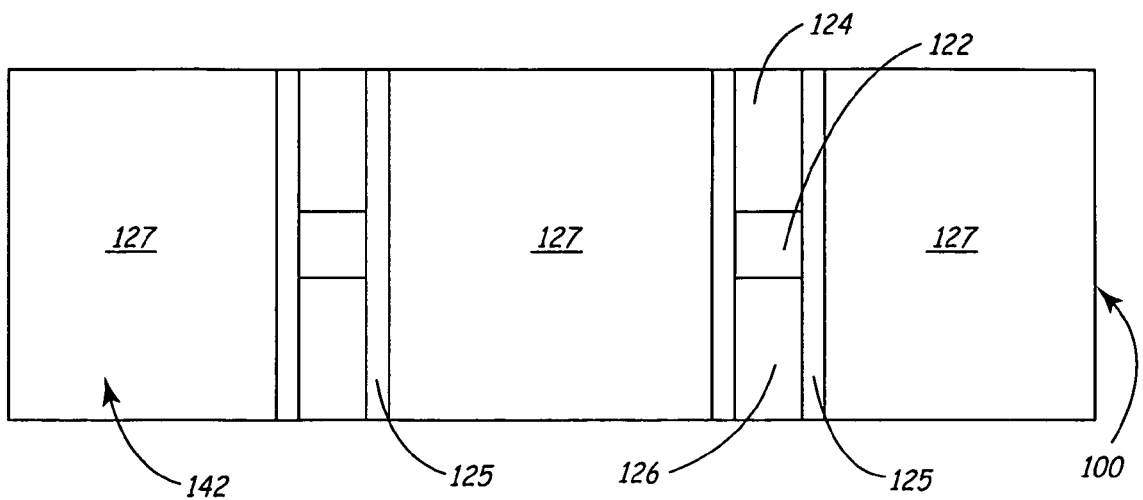
FIG. 20 is a top planar view of substrate having a thin film, through which certain underlying features are visible.
Figure 21:
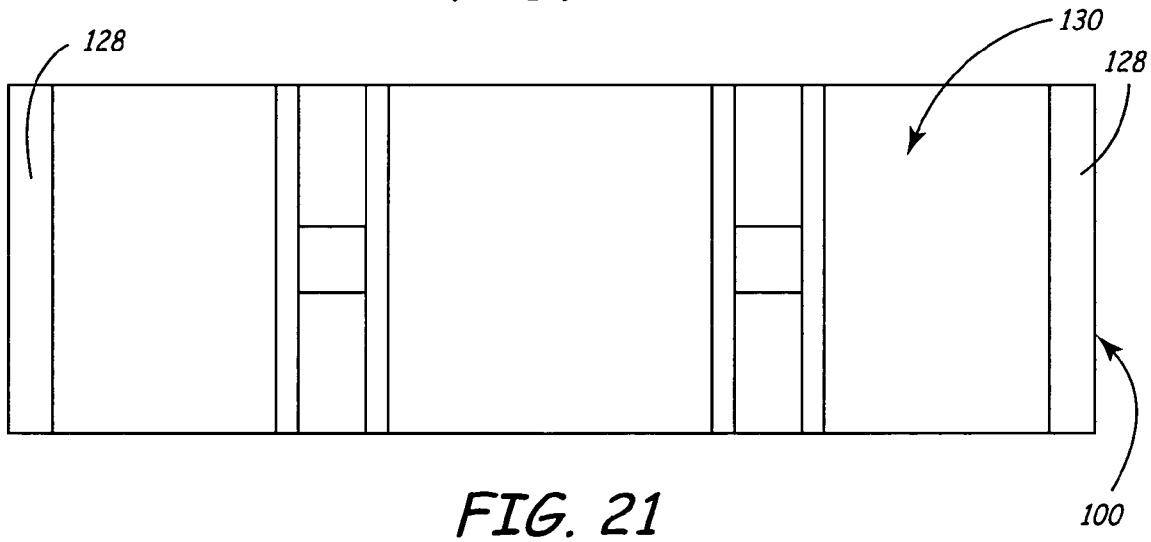
FIG. 21 is a top planar view of the substrate of FIG. 20 having a single layer of photoresist.

Referring to FIG. 20, a full substrate 100 is illustrated. That is, in this embodiment substrate 100 represents a head member that will eventually become a two channel thin film recording head. This particular embodiment has been chosen for illustration because certain surface features may be described for alignment purposes; however the present invention may be practiced on many different types of head members and configurations. Substrate 100 includes three non-critical areas 127 (that may or may not be magnetically permeable under the thin film) that are provided for spacing purposes. Glass bonds 125 couple the non-critical areas to a composite of ferrite 124, 126 and ceramic defining a subgap 122. Though not described in detail, this configuration allows for channel separation, thus differentiating it slightly from the substrate illustrated in FIG. 2. Subgap 122 is the area within which the timing based gaps will be defined through a thin film 142. In this embodiment, thin film 142 covers the entire upper surface of substrate 100. Despite the fact that thin film 142 covers the entire upper surface, the underlying features such as subgap 122 are somewhat visible therethrough.

Once substrate 100 has been prepared to the extent illustrated in FIG. 20, a first or under-layer of photoresist 130 is applied across a majority of the upper surface of substrate 100 (i.e., over thin fin film 142). One or both ends 128 may remain exposed (i.e., not covered by photoresist) so that the thin film can be grounded during the FIB milling process. This can be done by removing a portion of the photoresist after it is applied or patterning it so that the end(s) is not covered. As will be explained in greater detail later, under-layer 130 is for protective and filtering purposes and need not be patterned in any particular manner, however, it should be prepared (such as by hard baking) so that another layer of photoresist can be subsequently added and patterned. Under-layer 130 can be applied over the entire upper surface or only over smaller area(s), as desired.

Figure 22:
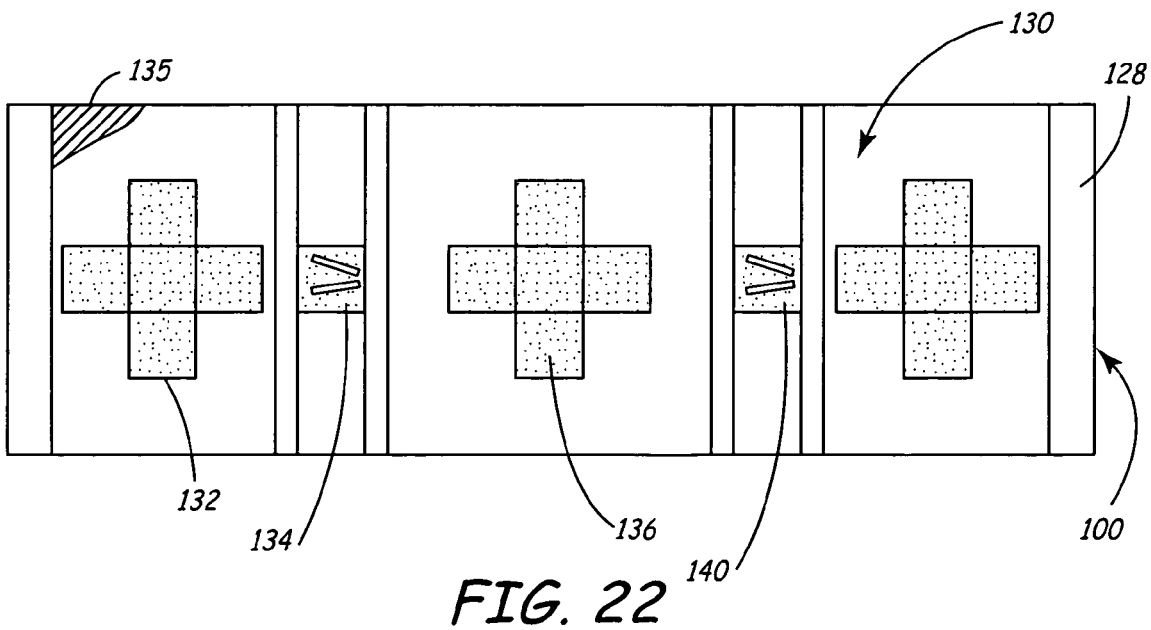
FIG. 22 is a top planar view of the substrate of FIG. 21 having a second layer of photoresist patterned over the first.
Figure 23:
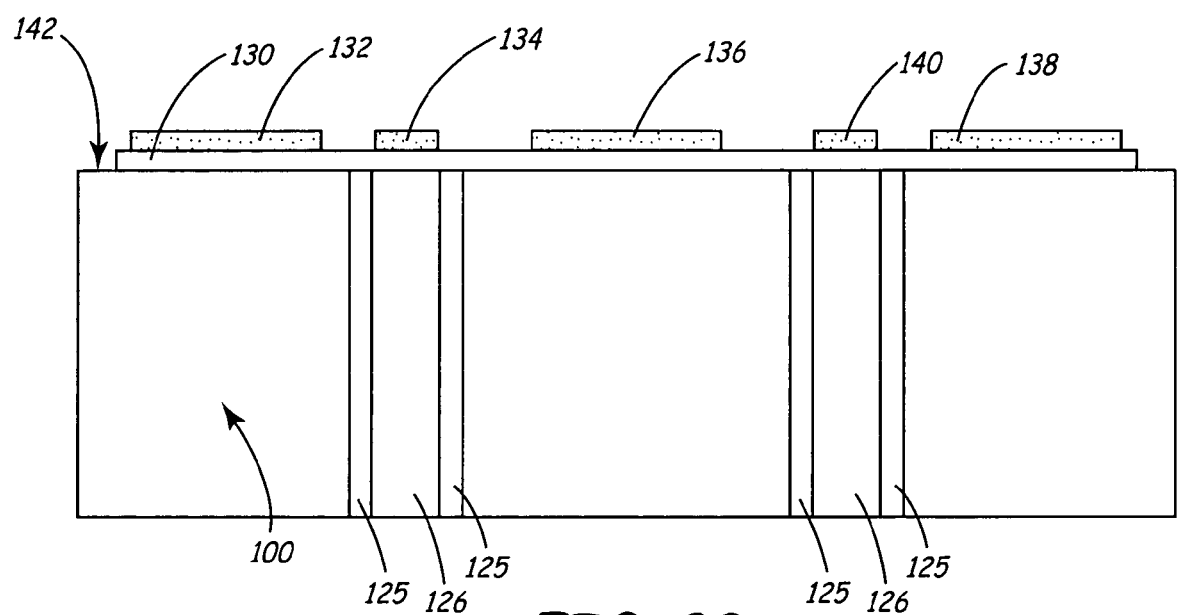
FIG. 23 is a side elevational view of the substrate of FIG. 22.

After under-layer 130 is applied and prepared (e.g. hardened), additional layers of photoresist can be precisely added and patterned, as illustrated in FIGS. 22 and 23. Covering each sub-gap 122, or more appropriately using each sub gap 122 for alignment purposes is a photoresist gap pattern 134, 140. Gap patterns 134, 140 are independent from each other and include areas that define the location of the eventual recording gaps in the proper timing based pattern. Gap patterns 134, 140 are applied with a high degree of precision to define the location of the recording gaps. In addition, fiducials or alignment patterns 132, 136, 138 can be patterned in non-critical areas 127 and are also independent from one another and from the gap patterns. That is, the various gap patterns and fiducials constitute a second (or subsequent) layer of photoresist, but each portion is separate and differentiated from the other. Of course, multiple components (i.e., a fiducial and gap pattern, multiple gap patterns, etc.) could alternatively be provided in a single, integrated layer though not shown as such. Alignment pattern 132, 136, 138 can serve a number of purposes. First, they provide identifiable features in an area that is otherwise featureless, allowing the FIB operator to more easily position and orientate the FIB. Second, they provide an area that can be imaged to focus the FIB and correct for any errors, such as astigmatism or magnification issues, in a protected area preventing damage and corrosion from occurring on the surface. Third, they can be positioned very precisely defining orthogonal coordinates relative to gap patterns 134. The "cross" pattern or a similar pattern (if accurately patterned) is useful in precisely aligning the X and the Y (or vertical and horizontal) alignment as it is desirable to have this alignment as true as possible. These patterns are imaged by the FIB, usually at a low voltage intensity to minimize the removal of the photoresist pattern. Thus, the FIB operator can better align the FIB while initially imaging and otherwise setting up the FIB. This leads to a greater ease and accuracy in aligning the FIB with gap patterns 134, 140. To further facilitate the alignment, each area where a gap is to be formed can include an alpha-numeric descriptor (e.g., channels 1-5 designated as 1, 2, 3, 4 and 5 respectively). The alpha-numeric identifier can be patterned or otherwise applied at such a scale as to make it discernable when imaged by the FIB.

Figure 24:
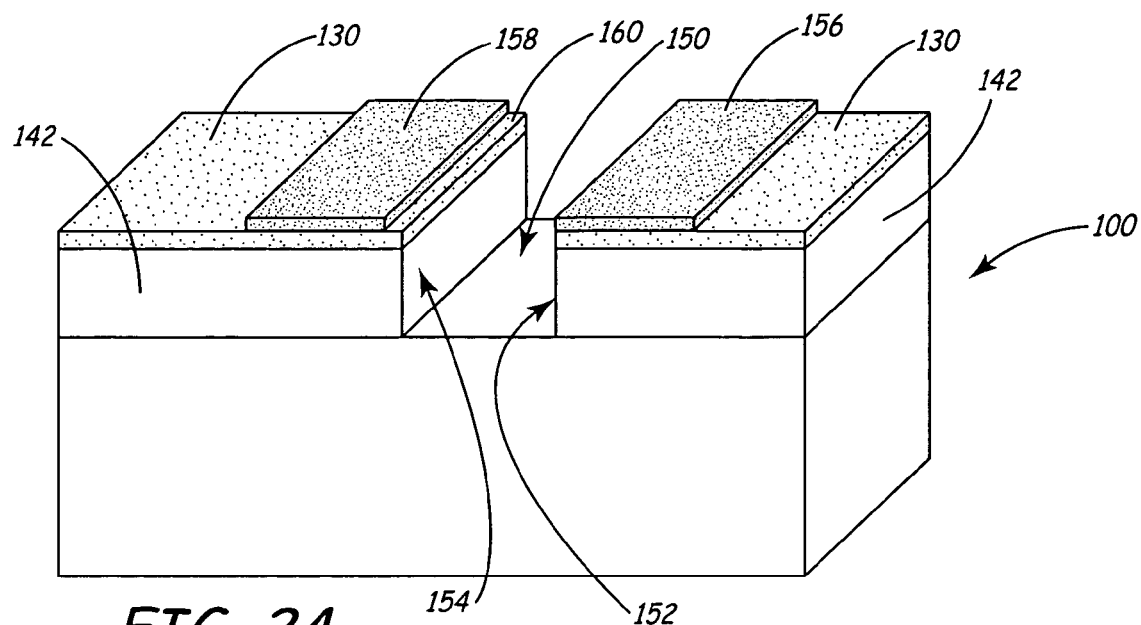
FIG. 24 is a perspective view of a channel cut through a portion of the substrate of FIG. 22.
Figure 25:
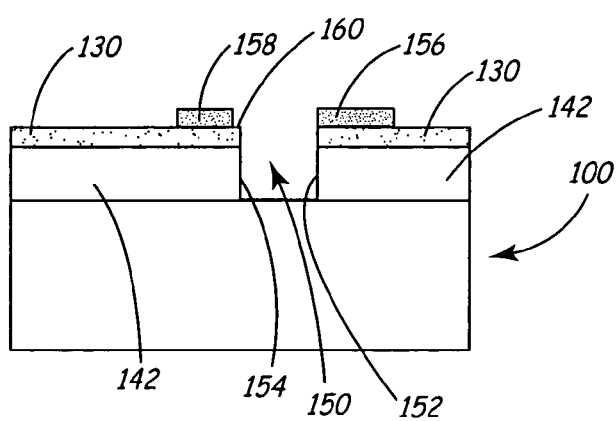
FIG. 25 is a side elevational view of the substrate of FIG. 24.
Figure 26:
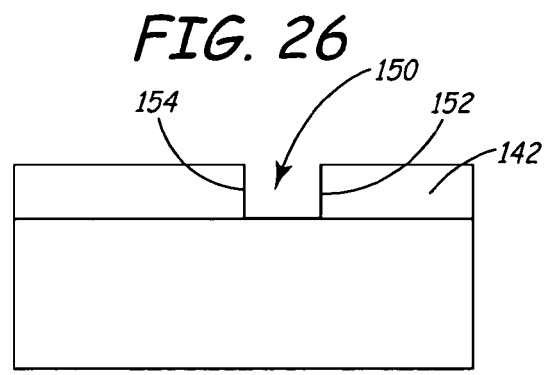
FIG. 26 is a side elevational view of the substrate of FIG. 25 after the photoresist has been removed.

FIGS. 24 and 25 illustrate views of a portion of subgap 134 after milling. In particular, these Figures illustrate how a precise gap can be created, even after experiencing a degree of beam shift. In this example, the beam shift would have moved the actual cutting area towards the right (as illustrated). That is, a first half gap pattern 158 would have essentially been untouched by the FIB beam. Second half gap pattern 156, was cut through by the FIB. However, because of the presence of under-layer of photoresist 130, the FIB always cuts through a portion covered by photoresist despite the beam shift. Thus, the Gaussian nature of the beam will not round the corners of gap 150 (though not shown, the photoresist may be rounded by this effect) and both first and second gap sidewalls 152, 154 are substantially vertical. In addition, any redeposition that occurs on the upper surface will occur on a layer of photoresist. Thus, when the photoresist is eventually removed so is all of the redeposition, leaving a smooth and intact thin film layer 142, as illustrated in FIG. 26. As a practical matter, the milling technique will often extend somewhat into the substrate 100, though not illustrated as such. This is desireable as it assures that a magnetically shorted gap will be avoided.

Thus, double photolithography as taught herein serves to provide an initial under-layer 130 over any portion of the surface that might be milled, protecting it and assuring a clean milling process that substantially eliminates redeposition on the upper surface. A second patterned layer of alignment patterns 132, 136, 138 and gap patterns 134, 140 can be precisely positioned on top of under-layer 130 so that the FIB can be precisely aligned to cut the gaps in the proper position and orientation. The thickness of the under-layer 130 must be chosen to provide its protective and filtering effects throughout the alignment and milling process. This determination will be based on the thickness of the thin film 142 and the time required for exposure to the beam. The patterned photoresist (i.e., the second layer) should at least be thick enough to provide an appropriate visual target.

It may also be desireable to apply a thin layer of conductive metal 135 (shown partially in FIG. 22) such as, e.g., gold, chrome or FeNi over the exposed portions of both layers of photoresist. Typically, such a conductive layer would be applied to a thickness of about 150 Å and will be removed with the photoresist when the photoresist is removed. The thin conductive layer is applied primarily for decharging the surface but also helps produce a better image when the FIB images the surface. That is, the metal layer provides more free electrons to image with, but by draining the surface (i.e., by applying contacts to each end of the head substrate in contact with the metal layer), stray charge is removed. This serves to also prevent the substrate being milled from becoming charged during the milling process.

As described above, a double layer technique has been presented. In one embodiment, each layer is formed from photoresist. However, any material that can be patterned onto a substrate and/or onto another layer and then removed without damaging the substrate, can be used as a masking layer. Furthermore, two different materials could be used in combination to form the first and second layer. "Diamond like carbon" (DLC), photoresist, metal layers, Si, or any patternable material could be utilized, so long as the interaction between the milling device and that material produces desirable results. Alternatively, a single protective layer could be applied in some embodiments where sufficient underlying detail can provide sufficiently precise alignment with the tools, techniques, and scales used for milling.

The above head fabrication process has been described with respect to a magnetic recording head employing a timing based servo pattern. However, the process could be applied equally well to any type of thin film recording head or to various semiconductor, MEMS, or other nano- or micro-scale fabrications. That is, those of ordinary skill in the art will appreciate that the FIB milling of the gaps could accommodate any shape or pattern, including the traditional single gap used in half-track servo tracks. The present invention provides a way to have every milled boundary milled through a protective layer of photoresist while still allowing precise masking to be defined that could not be achieved in a single layer edge to edge type pattern. In addition, various non-milled portions of the surface can be protected from the corrosive effects of stray Gallium exposure.

Those skilled in the art will further appreciate that the present invention may be embodied in other specific forms without departing from the spirit or central attributes thereof. In that the foregoing description of the present invention discloses only exemplary embodiments thereof, it is to be understood that other variations are contemplated as being within the scope of the present invention. Accordingly, the present invention is not limited in the particular embodiments which have been described in detail therein. Rather, reference should be made to the appended claims as indicative of the scope and content of the present invention.

We claim:

1. A method comprising:
providing a first layer of photoresist on a substrate to form a protective layer, wherein the first layer of photoresist is provided over substantially all of an upper surface of the substrate except for at least one predefined area of the substrate that is exposed thereby providing grounding during a milling process utilizing a milling device;
hard baking the first layer of photoresist prior to applying a second layer of photoresist;
providing the second layer of photoresist on an upper surface of the first layer to define a target area; and
milling the target area with the milling device.

2. The method of claim 1, wherein the substrate includes a thin film on at least a portion of an upper surface of the substrate, wherein the first layer of photoresist is provided over at least a portion of the thin film.

3. The method of claim 1 wherein the second layer of photoresist includes a plurality of target areas each defined by an independent portion of the second layer.

4. The method of claim 1, wherein the second layer of photoresist defines a writing gap for a magnetic recording head.

5. The method of claim 1, wherein the second layer of photoresist defines a timing based writing gap for a magnetic recording head.

6. The method of claim 1, further comprising positioning the first and second layer of photoresist such that milling the target area comprises milling boundaries through photoresist despite beam shifting.

7. The method of claim 1, wherein the second layer includes at least one fiducial mark for aligning an orientation of the milling device.

8. The method of claim 7, wherein the fiducial mark is also used to set up the milling device to correct for focusing, astigmatism and magnification errors.

9. The method of claim 1 wherein the milling device is a focused ion beam.

10. The method of claim 1, further comprising depositing a layer of conductive material over the first and the second layer of the photoresist.

11. The method of claim 10 wherein the conductive material is metal.

12. The method of claim 11 wherein the metal is NiFe.

13. The method of claim 1 wherein the target area is a general representation of a pattern to be milled.

14. The method of claim 1, wherein the target area is an identifiable mark to provide an origin for a coordinate system.

15. The method of claim 14, further comprising determining a milled pattern with respect to the identifiable mark based on the coordinate system.

16. The method of claim 1, wherein the second layer includes at least one fiducial mark for aligning an orientation of the milling device.

17. The method of claim 16, wherein the fiducial mark is also used to set up the milling device to correct for focusing, astigmatism and magnification errors.

18. The method of claim 1, wherein the milling device is a focused ion beam.

19. The method of claim 1, further comprising depositing a layer of conductive material over the first and the second layer of the photoresist.

20. The method of claim 19, wherein the conductive material is metal.

21. The method of claim 20, wherein the metal is NiFe.

22. A method comprising:
providing a first layer of photoresist on a substrate to form a protective layer, wherein the first layer of photoresist is provided over substantially all of an upper surface of the substrate;
hard baking the first layer of photoresist prior to applying a second layer of photoresist;
providing the second layer of photoresist on an upper surface of the first layer to define a target area, the second layer of photoresist defining a writing gap for a magnetic recording head; and
milling the target area with a milling device.

23. A method comprising:
providing a first layer of photoresist on a substrate to form a protective layer, wherein the first layer of photoresist is provided over substantially all of an upper surface of the substrate;
hard baking the first layer of photoresist prior to applying a second layer of photoresist;
providing the second layer of photoresist on an upper surface of the first layer to define a target area, the second layer of photoresist defining a timing based writing gap for a magnetic recording head; and
milling the target area with a milling device.

24. A method comprising:
providing a first layer of material on a substrate to form a protective layer, wherein the first layer of material is provided over substantially all of an upper surface of the substrate;
providing a second layer of patternable material on an upper surface of the first layer to define a target area;
positioning the first and second layers such that milling the target area defined by the second layer of patternable material comprises milling boundaries through the first layer of material despite beam shifting; and
milling the target area with a milling device through the first layer of material and into the substrate to form a gap in the substrate having substantially vertical sidewalls.

25. A method comprising:
providing a first layer of patternable material on a substrate to form a protective layer, wherein the first layer of patternable material is provided over substantially all of an upper surface of the substrate including at least a portion of a target area that is to be milled in the substrate;
hard baking the first layer of patternable material prior to applying a second layer of patternable material;
providing the second layer of patternable material on an upper surface of the first layer to define the target area, wherein the target area comprises an identifiable mark to provide an origin for a coordinate system; and
milling the target area with a milling device through the first layer of patternable material and into the substrate to form a gap in the substrate having substantially vertical sidewalls.

26. The method of claim 25, further comprising determining a milled pattern with respect to the identifiable mark based on the coordinate system.

* * * * *